US008660822B2

(12) United States Patent
Sharma et al.

(10) Patent No.: US 8,660,822 B2
(45) Date of Patent: Feb. 25, 2014

(54) SYSTEM AND METHOD FOR GENERATING THREE DIMENSIONAL FUNCTIONAL SPACE RESERVATION SYSTEMS OF A VEHICLE

(75) Inventors: Anurag H. K. Sharma, Bangalore (IN); Varun Natarajan, Bangalore (IN); Srinivasan Bhaskaran, Bangalore (IN); Kannan Thirumalai, Tamilnadu (IN); Hari Prasad Reddy, Bangalore (IN); Arpita Sen, Kolkata (IN)

(73) Assignee: Airbus Engineering Centre India, Bangalore, Karnataka (IN)

( * ) Notice: Subject to any disclaimer, the term of this patent is extended or adjusted under 35 U.S.C. 154(b) by 432 days.

(21) Appl. No.: 13/020,811

(22) Filed: Feb. 4, 2011

(65) Prior Publication Data

US 2011/0196655 A1    Aug. 11, 2011

(30) Foreign Application Priority Data

Feb. 11, 2010  (IN) .............................. 346/CHE/2010

(51) Int. Cl.
*G06F 17/50*     (2006.01)
(52) U.S. Cl.
USPC ............................................................. 703/1
(58) Field of Classification Search
USPC ............................................................. 703/1
See application file for complete search history.

(56) References Cited

U.S. PATENT DOCUMENTS

| | | | |
|---|---|---|---|
| 5,019,992 A * | 5/1991 | Brown et al. ................... | 703/13 |
| 7,529,648 B2 * | 5/2009 | Baum et al. ...................... | 703/1 |
| 7,529,649 B2 | 5/2009 | Lee et al. | |
| 7,793,250 B2 | 9/2010 | Saini et al. | |
| 2002/0026296 A1 * | 2/2002 | Lohmann et al. ................ | 703/1 |
| 2003/0083767 A1 * | 5/2003 | Karlsberg ...................... | 700/103 |
| 2005/0080502 A1 * | 4/2005 | Chernyak et al. ............... | 700/97 |
| 2005/0091628 A1 * | 4/2005 | Kragh et al. .................... | 716/13 |
| 2005/0114096 A1 * | 5/2005 | Baum et al. ...................... | 703/1 |
| 2008/0140242 A1 * | 6/2008 | Whitmer ......................... | 700/98 |
| 2009/0146997 A1 | 6/2009 | Sato | |
| 2010/0146466 A1 * | 6/2010 | Hadley et al. ..................... | 716/5 |

FOREIGN PATENT DOCUMENTS

EP          1672548 A1     6/2006

* cited by examiner

*Primary Examiner* — Dwin M Craig
(74) *Attorney, Agent, or Firm* — Prakash Nama; Global IP Services, PLLC (57) ABSTRACT

A system and method for generating three dimensional functional space reservation systems of a vehicle from a conceptual space reservation is disclosed. In one embodiment, a method includes collecting functional, connectivity and geometrical information from design databases associated with a conceptual space reservation of a vehicle upon receiving a request from a client device for three dimensional functional space reservation systems. The method also includes creating a mathematical model in a binary form using the functional, connectivity and geometrical information. The method further includes applying a set of rules and checks governing a design of the vehicle to the mathematical model, and applying a set of functional attributes to the mathematical model for creating connectivity information in the mathematical model. Moreover, the method includes generating the three dimensional functional space reservation systems of the vehicle for a computer-aided design standard platform based on the mathematical model.

15 Claims, 12 Drawing Sheets

FUNCTIONAL ATTRIBUTE PANEL

CURRENT SELECTION:

PRODUCUT

PRODUCT:ADDED PROPERTIES

| VAULTNAME | V92Y90290200 |
| ROUTES | |
| ATA | 0 |
| TUBESPECIFICATION | NORMAL ZONE |
| INTERNALDIAMETER | 0 |
| DIAMETER | 0 |
| LAYER | 0 |
| ROUTLIST | 0 |
| SECTIONNUMBER | S16-18 |
| PRESSURECATEGORY | |
| LINECOLOR | NO COLOR |
| SPARESLEEVE | 0 |
| DESIGNPRESSURE | 0 |
| TRANSVERSE | 0 |
| ACFUNCTION | |
| REFERENCEFULLDIAMETER | 45 |

MORE...

OK   APPLY   CLOSE

SYSTEM AND METHOD FOR GENERATING THREE DIMENSIONAL FUNCTIONAL SPACE RESERVATION SYSTEMS OF A VEHICLE

RELATED APPLICATIONS

Benefit is claimed under 35 U.S.C. 119(a)-(d) to Foreign application Serial No. 346/CHE/2010 filed in INDIA entitled "SYSTEM AND METHOD FOR GENERATING THREE DIMENSIONAL FUNCTIONAL SPACE RESERVATION SYSTEMS OF A VEHICLE" by AIRBUS ENGINEERING CENTRE INDIA, filed on Feb. 11, 2010, which is herein incorporated in its entirety by reference for all purposes.

FIELD OF TECHNOLOGY

The present invention relates to the field of system architecture design, more particularly, the present invention relates to system architecture design of a vehicle, such as an aircraft, a ship, a train and the like.

BACKGROUND

Figure 1:
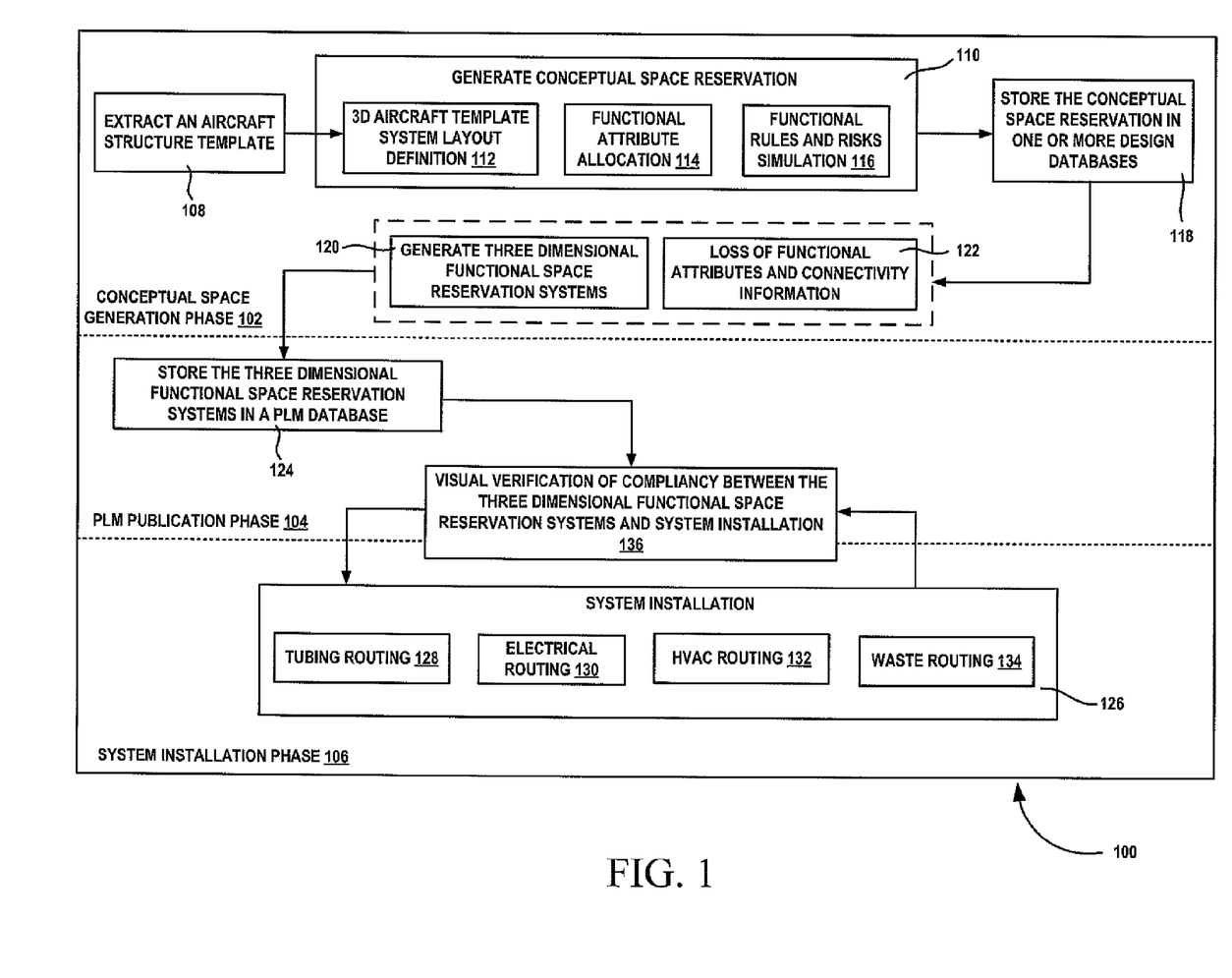
FIG. 1 illustrates a system installation process of an aircraft.

FIG. 1 illustrates a system installation process 100 of an aircraft. In particular, FIG. 1 illustrates an electrical and tubing installation process 100. In FIG. 1, the system installation process 100 may be divided into three phases, such as a conceptual space reservation phase 102, a project lifecycle management (PLM) publication phase 104, and a system installation phase 106. In the conceptual space reservation phase 102, an aircraft structure template having an outer boundary of the aircraft may be extracted from a computer-aided design (CAD) file as in step 108.

In step 110, a conceptual space reservation is generated by referencing the outer boundary of the aircraft. The conceptual space reservation may be a geometric figure of the aircraft where space for design entities of the aircraft as well as functional attributes associated with the design entities may be reserved during the conceptual space reservation phase 102. For example, the conceptual space reservation for equipments, cables and tubes may be performed with geometry size approximation.

Design entities of the aircraft are defined by functional drawings and space is reserved for these design entities during the system layout definition 112. Additionally, functional attributes allocation 114 and functional rules and risk simulation 116 associated with installation of the various systems in the aircraft may be performed during the conceptual space reservation phase 102.

Then, in step 118, the conceptual space reservation of the aircraft is stored in one or more design databases such as a graphics tool database, a legacy CAD tool database, an equipment database and a schematic database. In step 120, three dimensional space reservation systems of the aircraft may be manually generated based on the conceptual space reservation stored in the one or more design databases. Since a designer who had prepared the conceptual space reservation may not be the same designer who has prepared the three dimensional space reservation systems, the functional attributes and/or connectivity information associated with the design entities may not be accurately transformed during conversion from the conceptual space reservation to the three dimensional functional space reservation. Thus, the designer who has created the three dimensional space reservation systems of the aircraft may need to recreate or rebuild the functional attributes and/or connectivity information during the detailed design of the aircraft.

Then, in step 124, the three dimensional functional space reservation systems may be stored in a PLM database during the PLM publication phase 104. Further, in step 126, an installation of various systems of the aircraft is performed, where a tubing routing 128, an electrical routing 130, a heating, ventilating, and air conditioning (HVAC) routing 132, a waste routing 134, etc. associated with the aircraft are implemented. In step 136, visual verification of each aircraft system being installed is repeatedly performed with respect to the three dimensional functional space reservation systems obtained from the PLM database. The visual verification of the compliance may be necessary at this juncture due to the loss of functional attributes and/or connectivity information during generation of the three dimensional functional space reservation systems of the aircraft, although the functional and/or connectivity information may have been available while the conceptual space reservation of the aircraft was being generated.

SUMMARY

A system and method for generating three dimensional functional space reservation systems of a vehicle is disclosed. According to one aspect of the invention, a system for generating three dimensional functional space reservation systems of a vehicle (e.g., an aircraft, a ship, a train and the like) includes a processor and a memory. The memory coupled to the processor includes a file reader tool.

The file reader tool includes functional geometrical information (FGI) reader module for collecting functional, connectivity and geometrical information from one or more design databases associated with a conceptual space reservation of the vehicle. The functional, connectivity and geometrical information is collected upon a request from a client device for three dimensional functional space reservation system.

The file reader tool also includes a mathematical modeler module for receiving the functional, connectivity and geometrical information and creating a mathematical model in a binary form. Further, the file reader tool includes a standardization module for applying a set of rules and checks governing a design of the vehicle to the mathematical model, and a functional mapper module for applying a set of functional attributes to the mathematical model. Also, the file reader tool includes a writer module for generating the three dimensional functional space reservation systems of the vehicle for a computer-aided design (CAD) platform based on the mathematical model. Moreover, the file reader tool includes an interrogating module for interrogating the three dimensional functional space reservation systems in the CAD standard platform to obtain the functional, connectivity and geometrical information of the vehicle.

According to another aspect of the present invention, a network system for generating three dimensional functional space reservation systems of a vehicle includes a plurality of client devices for generating a request for the three dimensional functional space reservation systems of the vehicle. The network system also includes a plurality of database servers having a plurality of design databases. Each of the plurality of design databases stores functional, connectivity and geometrical information associated with the conceptual space reservation of the vehicle. Further, the network system includes a plurality of application servers for generating the three dimensional functional space reservation systems of the vehicle for a CAD standard platform based on the functional, connectivity and geometrical information associated with the conceptual space reservation. In addition, the network system includes a project lifecycle management (PLM) database for storing the three dimensional functional space reservation systems.

According to a yet another aspect of the present invention, a method for creating three dimensional functional space reservation systems of a vehicle includes collecting functional, connectivity and geometrical information from one or more design databases associated with a conceptual space reservation of the vehicle upon a request from a client device for the three dimensional functional space reservation systems. The method also includes creating a mathematical model in a binary form using the functional, connectivity and geometrical information.

Further, the method includes applying a set of rules and checks governing a design of the vehicle to the mathematical model, and applying a set of functional attributes to the mathematical model for creating connectivity information in the mathematical model. In addition, the method includes generating the three dimensional functional space reservation systems of the vehicle for a CAD standard platform based on the mathematical model. Furthermore, the method includes storing the three dimensional function space reservation systems in a PLM database. Moreover, the method includes interrogating the three dimensional functional space reservation systems in the CAD standard platform to obtain functional, connectivity and geometrical information of the vehicle. Also, the method includes searching through the three dimensional functional space reservation systems to find connected components of a particular functionality and displaying the connected components associated with the three dimensional functional space reservation systems of the particular functionality.

The methods, apparatuses and systems disclosed herein may be implemented in any means for achieving various aspects. Other features will be apparent from the accompanying drawings and from the detailed description that follow.

BRIEF DESCRIPTION OF THE DRAWINGS

Various preferred embodiments are described herein with reference to the drawings, wherein.

The drawings described herein are for illustration purposes only and are not intended to limit the scope of the present disclosure in any way.

DETAILED DESCRIPTION

A system and method for generating three dimensional functional space reservation systems of a vehicle is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 2:
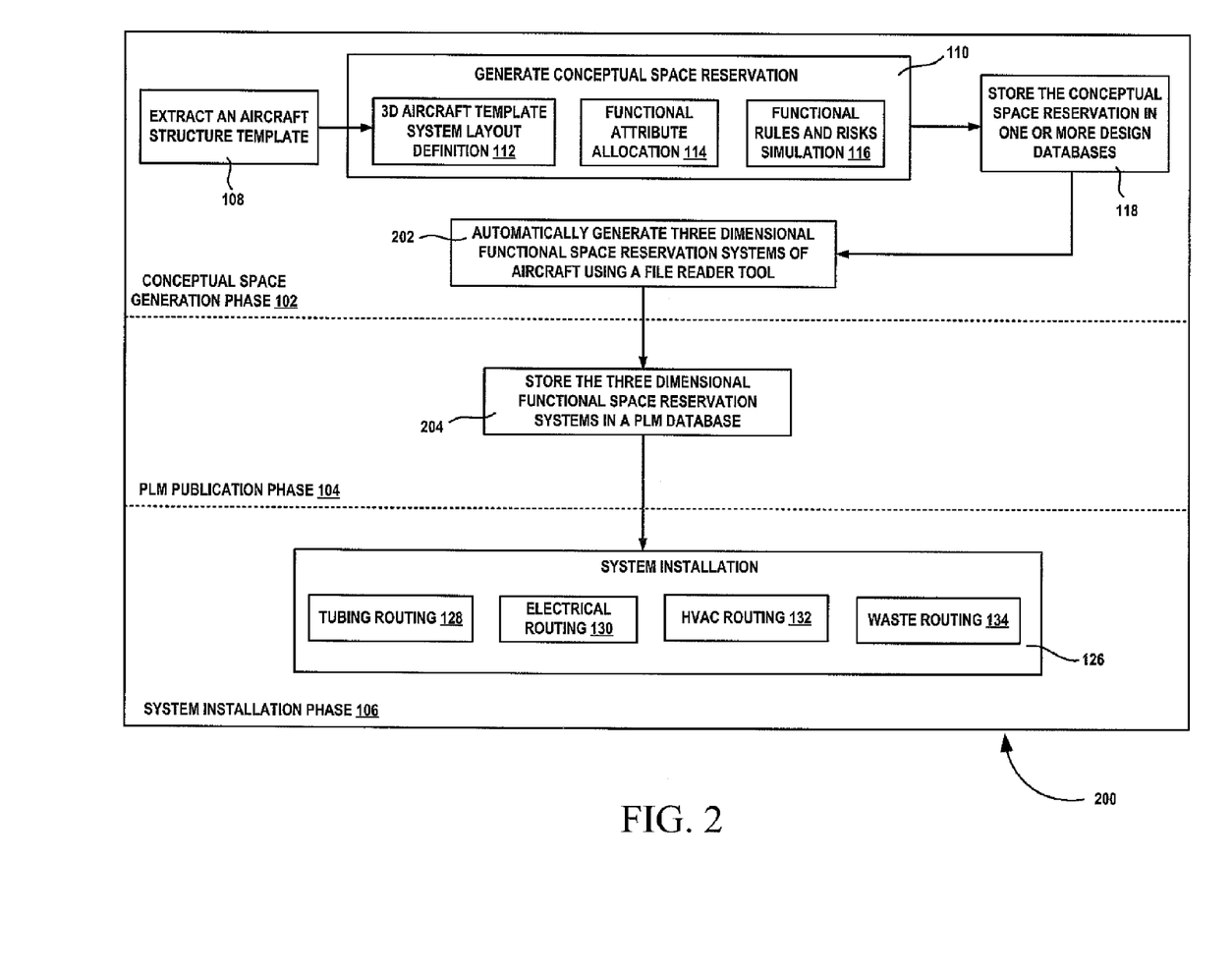
FIG. 2 illustrates a system installation process of an aircraft, according to an embodiment of the invention.
Figure 3:
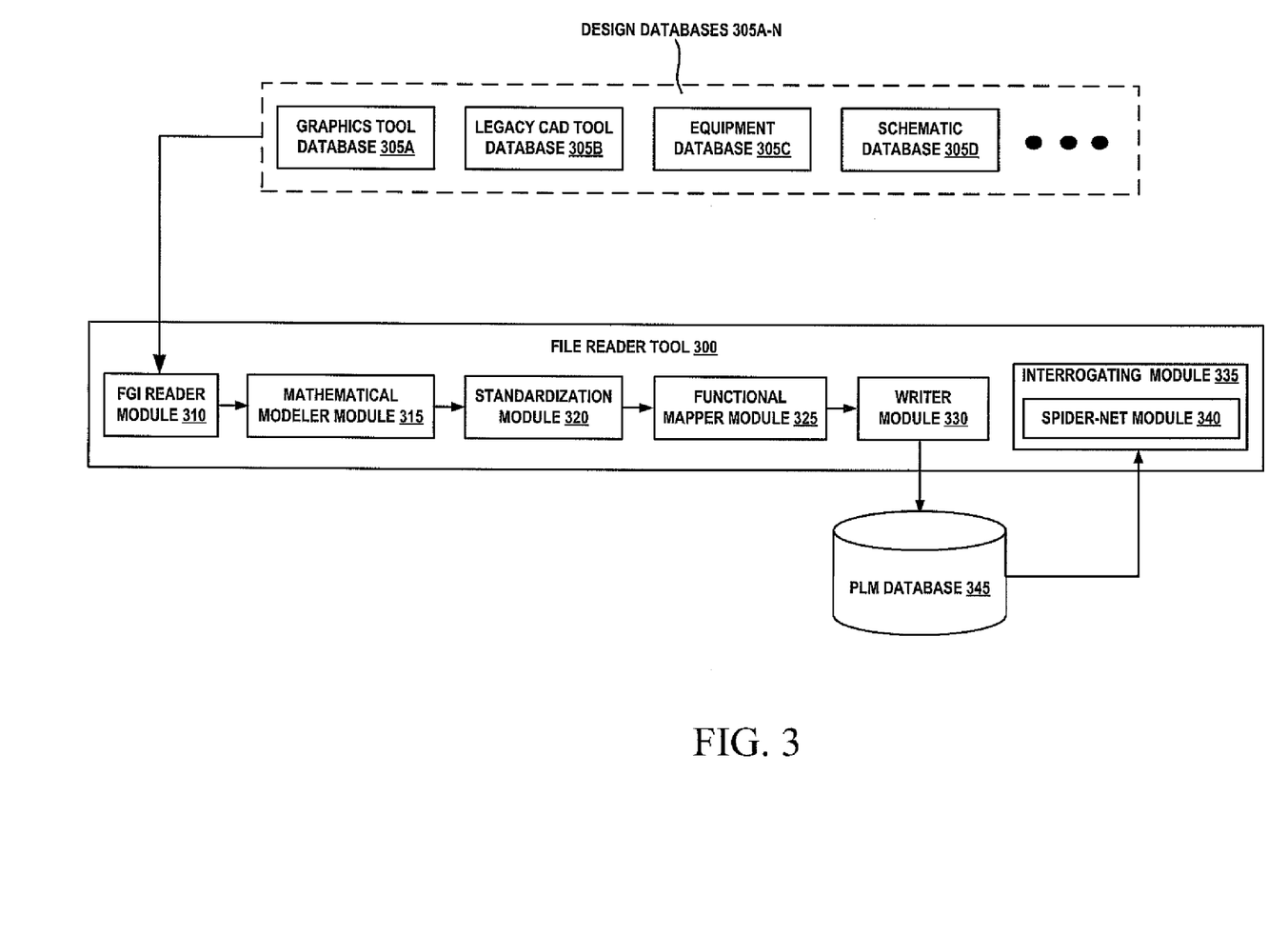
FIG. 3 illustrates a block diagram of a file reader tool for generating three dimensional functional space reservation systems of the aircraft, according to an embodiment of the invention.

FIG. 2 illustrates a system installation process 200 of an aircraft, according to one embodiment. In particular, FIG. 2 illustrates an electrical and tubing installation process 200. It can be seen from FIG. 2 that, the process 200 is similar to the process 100 of FIG. 1, except in the process 200, three dimensional functional space reservation systems of the aircraft (e.g., a hydraulic system, an electrical system, etc.) are generated automatically using a file reader tool (as illustrated in FIG. 3) based on functional, connectivity and geometrical information, as in step 202. The functional, connectivity and geometrical information may be collected from various design databases associated with a conceptual space reservation of the aircraft. The three dimensional functional space reservation systems are generated for a computer-aided design (CAD) standard platform and are stored in a file format in the PLM database as in step 204. For example, the three dimensional functional space reservation systems may contain positioning and orientation of equipments, electrical wires, pipes, hydraulic tube lines and so on and connection between other interconnected design entities.

According to the embodiment of the present invention, the process 200 retains functional attributes and connectivity information in the three dimensional functional space reservation systems. In other words, the process 200 eliminates the need to recreate or rebuild the functional attributes and/or connectivity information during the detailed design of the aircraft. It can be also noted that, the process 200 eliminates the need for visual verification of compliancy between the three dimensional functional space reservation systems and the system installation. Moreover, the process of generating of the three dimensional functional space reservation systems using the functional, connectivity and geometrical information associated with the conceptual space reservation is explained in greater detail in FIGS. 3 and 4.

FIG. 3 illustrates a block diagram of a file reader tool 300 for generating the three dimensional functional space reservation systems of the aircraft, according to an embodiment of the invention. As illustrated, the file reader tool 300 includes a functional geometrical information (FGI) reader module 310, a mathematical modeler module 315, a standardization module 320, a functional mapper module 325, and a writer module 330.

In an example operation, the FGI reader module 310 collects functional, connectivity and geometrical information from one or more design databases 305 associated with a conceptual space reservation of the aircraft. For example, for a hydraulic system, the functional information may include information associated with a pump of a hydraulic system. The connectivity information may include information of tubes, pipes and harnesses, power source, etc. connected to the pump. The geometrical information may include information related to space occupied by the pump, tubes, pipes, harnesses, power source, etc. and their respective orientation in the hydraulic system. It can be noted that, the installation and maintainability requirements for pumps are also considered during generation of the three dimensional space reservation systems.

The one or more databases 305A-N include a graphics tool database 305A, a legacy CAD tool database 305B, an equipment database 305C, a schematic database 305D and so on. The graphics tool database 305A may include information associated with the conceptual space reservation created using graphics tools such as Microsoft Visio®, Microsoft PowerPoint® and the like.

The legacy CAD tool database 305B may include information associated with the conceptual space reservation of the aircraft prepared using legacy tools. The equipment database 305C may include information associated with various equipments (e.g., pumps, power source, tubes, blowers, fans, etc.) used in the aircraft. The schematic database 305D may include schematic information (e.g., schematic diagram of electrical wiring of an electrical system) associated with various systems of the aircraft. It can be noted that, the one or more databases 305A-N may include databases storing information associated with different design areas associated with the conceptual space reservation.

It is appreciated that, the functional, connectivity and geometrical information is stored in the associated one of the graphics tool database 305A, the legacy CAD tool database 305B, the equipment database 305C and the schematic database 305D after a preliminary design for the conceptual space reservation has passed through maturity gates associated with the conceptual space reservation. In other words, the functional, connectivity and geometrical information in the one or more databases 305A-N is matured and is ready for use by the file reader tool 300.

Figure 4:
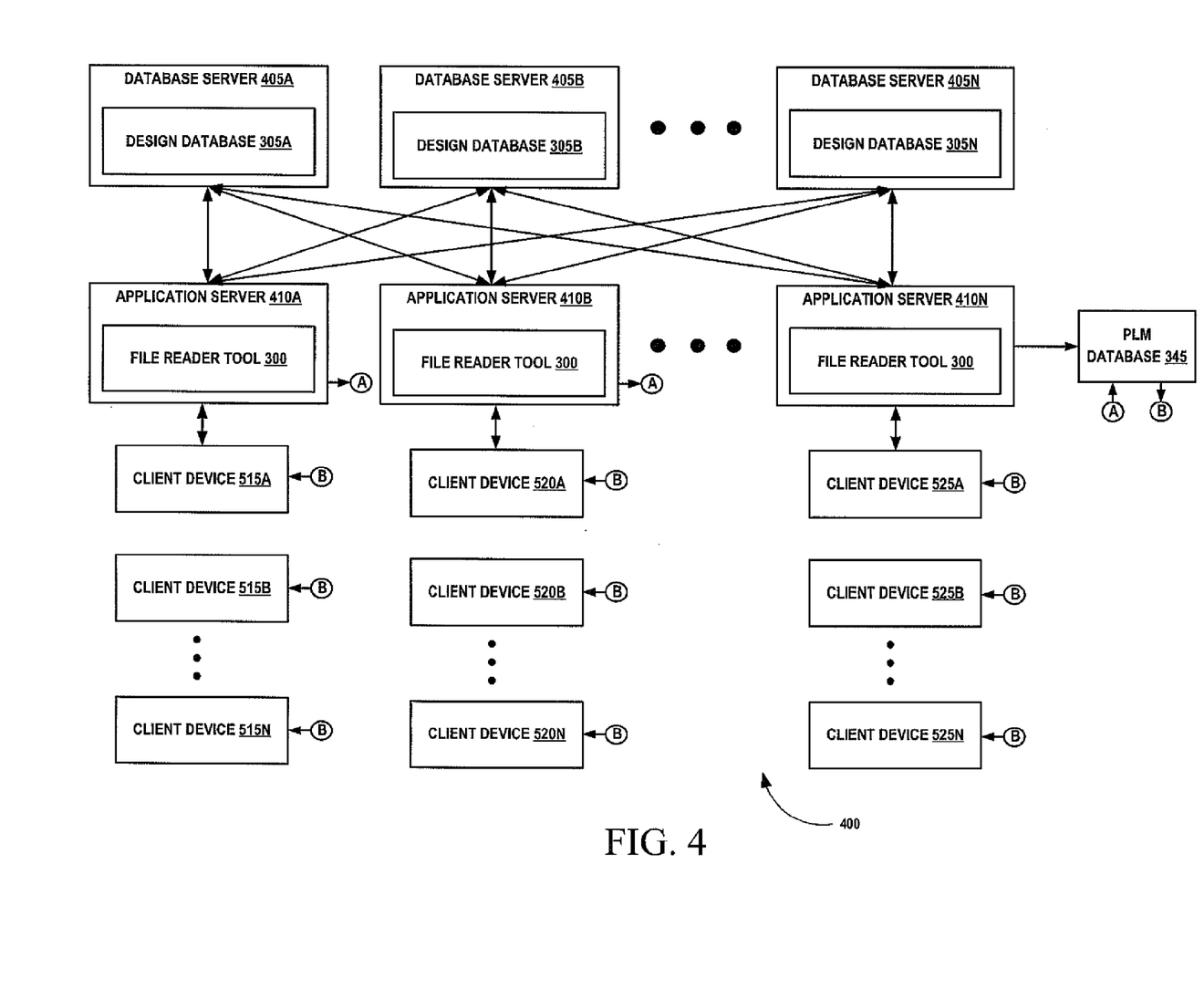
FIG. 4 illustrates a block diagram of an exemplary network system for generating a three dimensional functional space reservation system of an aircraft, according to an embodiment of the invention.

In one example embodiment, the FGI reader module 310 collects the functional, connectivity and geometrical information upon receiving a request from a client device (e.g., one of client devices as shown in FIG. 4) for three dimensional functional space reservation systems (e.g., a hydraulic system, an electrical system, and the like) of the aircraft.

The mathematical modeler module 315 is configured to receive the functional, connectivity and geometrical information from the FGI reader module 310 and creates a mathematical model based on the functional, connectivity and geometrical information. A mathematical model is a model having information related to relationships between functional information and geometrical information. In one example embodiment, the mathematical modeler module 315 stores the mathematical model in a binary form (e.g., in memory of an application server). The standardization module 320 applies a set of rules and checks governing a design of the aircraft to the mathematical model, as will be illustrated in FIGS. 5A and 5B.

The set of rules and checks are applied to check feasibility, thumb rule and prior aircraft system design knowledge from previous design programs. For example, the set of rules and checks includes a set of design rules and checks with respect to color layering, naming and part numbering of design entities based on a design standard, an information system standard and/or a PLM database standard.

Further, the functional mapper module 325 applies a set of functional attributes to the mathematical model to create connectivity information in the mathematical model. For example, the set of functional attributes may include setting pressure, flow, and temperature on a hydraulic system in the aircraft or setting voltage, current, and routing information on an electrical system in the aircraft. The writer module 330 then generates the three dimensional functional space reservation systems of the aircraft for a CAD platform based on the mathematical model (e.g., including data representing real world three dimensional geometry of design entities). As described in FIG. 2, the three dimensional functional space reservation systems are stored in a file format (e.g., a CAD file format) in a PLM database 345.

The file reader tool 300 also includes an interrogating module 335. The interrogating module 335 enables a user to interrogate the three dimensional functional space reservation systems in the CAD standard platform to obtain the functional, connectivity and geometrical information. The interrogating module 335 includes a spider-net module 340 for searching through the three dimensional functional space reservation systems to find connected components (e.g., equipment, pathway, route, etc.) of a particular functionality (e.g., water sewage, hydraulic system, electrical signal and the like).

Further, the spider-net module 340 displays the connected components of the particular functionality, as will be illustrated in FIGS. 7, 8A, 8B and 8C. For example, for a selected pathway, the spider-net module 340 may highlight all routes passing through the pathway and equipments to which the routes are connected. In this example, the connected components may include routes passing through the selected pathway and the equipments connected to the routes. The spider-net module 340 can also search through the spider-net (e.g., a network of the connected components) to find components at other end of the spider-net.

FIG. 4 illustrates a block diagram of an exemplary network system 400 for generating a three dimensional functional space reservation system of an aircraft, according to an embodiment of the invention. The network system 400 includes database servers 405A-N, application servers 410A-N and the PLM database 345. As illustrated, the design databases 305A-N reside in the database servers 405A-N, respectively. Further, the file reader tool 300 resides in each of the application servers 410A-N. The network system 400 includes client devices 415A-N, client devices 420A-N and client devices 425A-N. For example, each client device may be a workstation, a desktop, and a laptop.

In FIG. 4, each of the application servers 410A-N is coupled to the database servers 405A-N. Also, said each of the application servers 410A-N is coupled to the PLM database 345. Further, the client devices 415A-N, the client devices 420A-N and the client devices 425A-N are coupled to the application server 410A, the application server 410B and the application server 410N, respectively. Also, the client devices 415A-N, the client devices 420A-N and the client devices 425A-N are coupled to the PLM database 345.

In one exemplary implementation, the network system 400 is operable for generating the three dimensional functional space reservation system of the aircraft. For example, consider that, a client device 415A generate a request for the three dimensional functional space reservation system of the aircraft and forwards the request to the application server 410A. In such scenario, the file reader tool 300 in the application server 410A collects functional, connectivity and geometrical information associated with the conceptual space reservation of the aircraft from the design databases 305A-N.

Then, the file reader tool 300 generates the three dimensional functional space reservation system of the aircraft for a CAD standard platform based on the functional, connectivity and geometrical information (e.g., using the modules of the file reader tool 300 described in FIG. 3). On one hand, the application server 410A returns the three dimensional functional space reservation system to the client device 410A in response to the request. On the other hand, the application server 410A stores the three dimensional functional space reservation to the PLM database 345 such that the client devices 415A-N, 420A-N and 425A-N can use the three dimensional functional space reservation system from the PLM database 345.

Figure 5A:
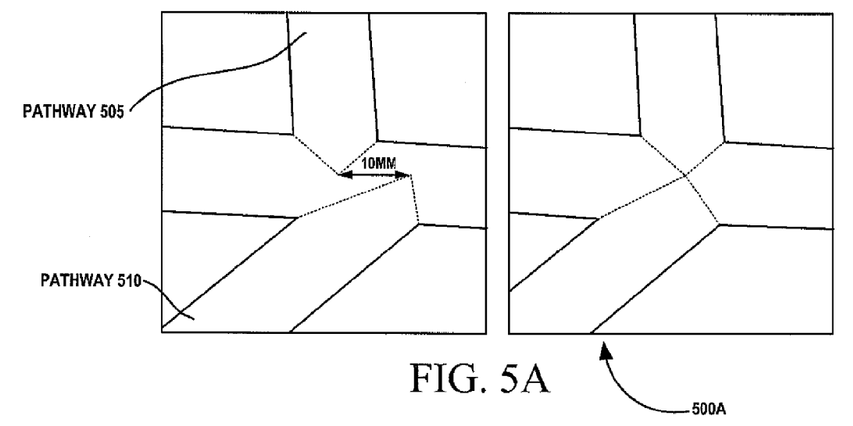
FIGS. 5A and 5B illustrate exemplary processes for applying a set of rules and checks governing a design of the aircraft using a standardization module of FIG. 3, according to an embodiment of the invention.
Figure 5B:
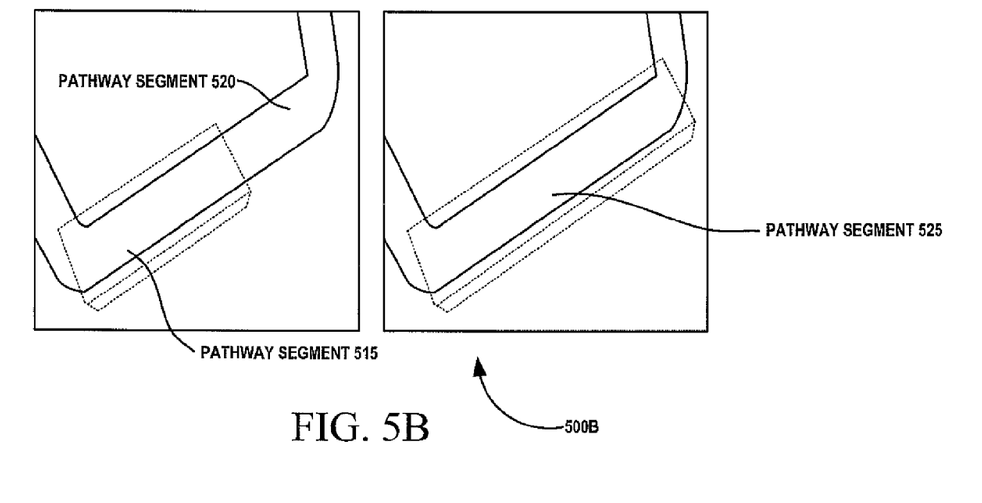

FIGS. 5A and 5B illustrate exemplary processes 500A and 500B for applying a set of rules and checks governing a design of an aircraft using the standardization module 320 of FIG. 3, according to an embodiment of the invention. The set of rules and checks includes a set of design rules and checks with respect to color layering, naming and part numbering of design entities based on a design standard, an information system standard and/or a PLM database standard. It is appreciated that, the set of rules and checks may be configured by an administrator of the network system 400 or the designer using the file reader tool 300 for generating the three dimensional functional space reservation system of the aircraft.

In one embodiment, the set of rules and checks are configured to check feasibility, thumb rule and prior aircraft system design knowledge from previous design programs. For example, the check for feasibility may include checking minimum bend radius at corners of the design entities, minimum thickness of the design entities, minimum distance between two design entities, and so on. As shown in FIG. 5A, pathways 502 and 504 are merged together at one point as distance between the pathways 502 and 504 is less than or equal to 10 mm. Similarly, as illustrated in FIG. 5B, pathway segments 506 and 508 are merged together to form a pathway segment 510 as the pathway segments 506 and 508 are in straight line and have identical names.

Figure 6:
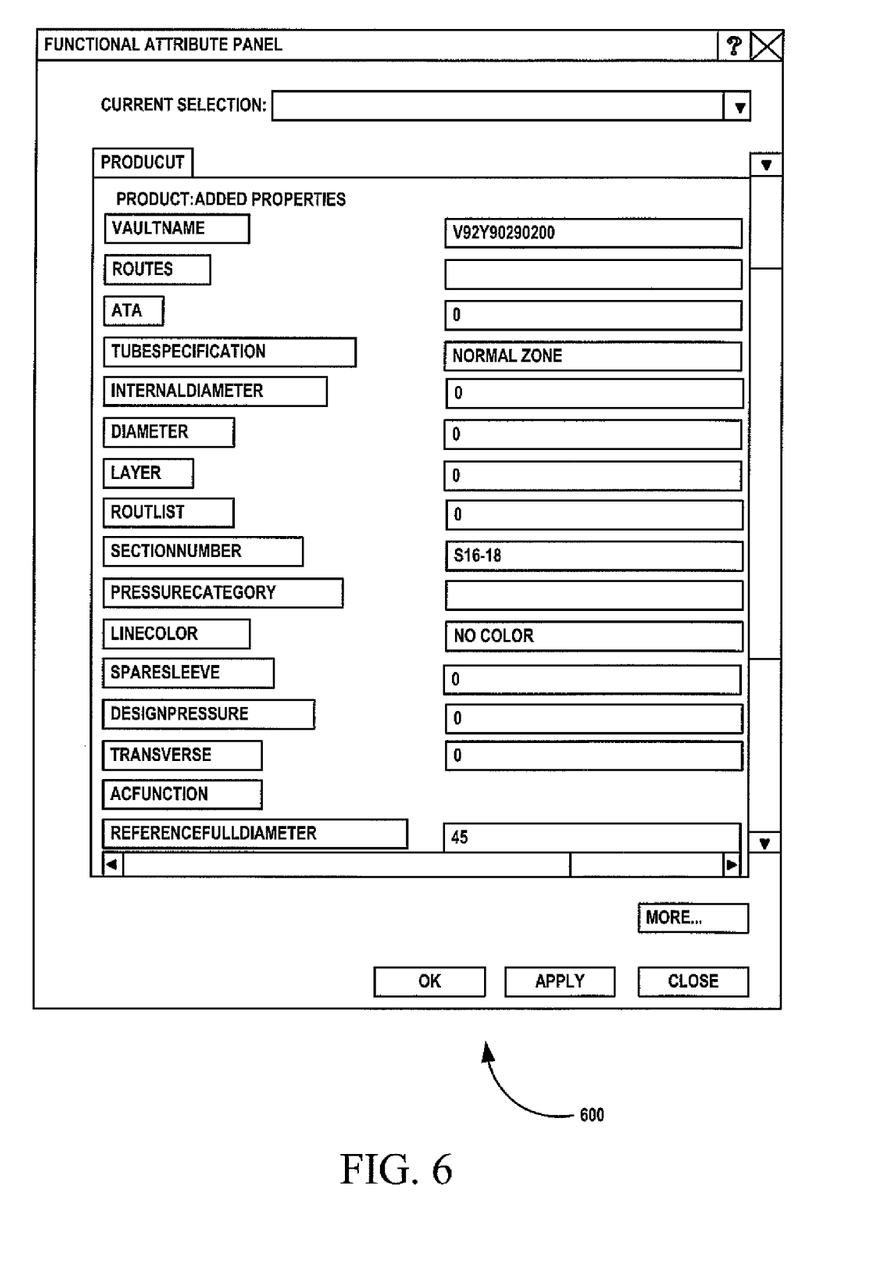
FIG. 6 illustrates a user interface view for configuring a set of functional attributes for applying to a mathematical model generated by a mathematical modeler module of FIG. 3, according to an embodiment of the invention.

FIG. 6 illustrates a user interface view 600 for configuring a set of functional attributes for applying to the mathematical model (e.g., equipment, pathways, etc.) generated by the mathematical modeler module 315 of FIG. 3, according to an embodiment of the invention. In one exemplary implementation, the user interface view 600 allows a user (e.g., a design engineer) to set pressure, flow and temperature on a hydraulic system of the aircraft. In another exemplary implementation, the user interface view 600 allows the user to set voltage, current and route information on an electrical system of the aircraft.

Figure 7:
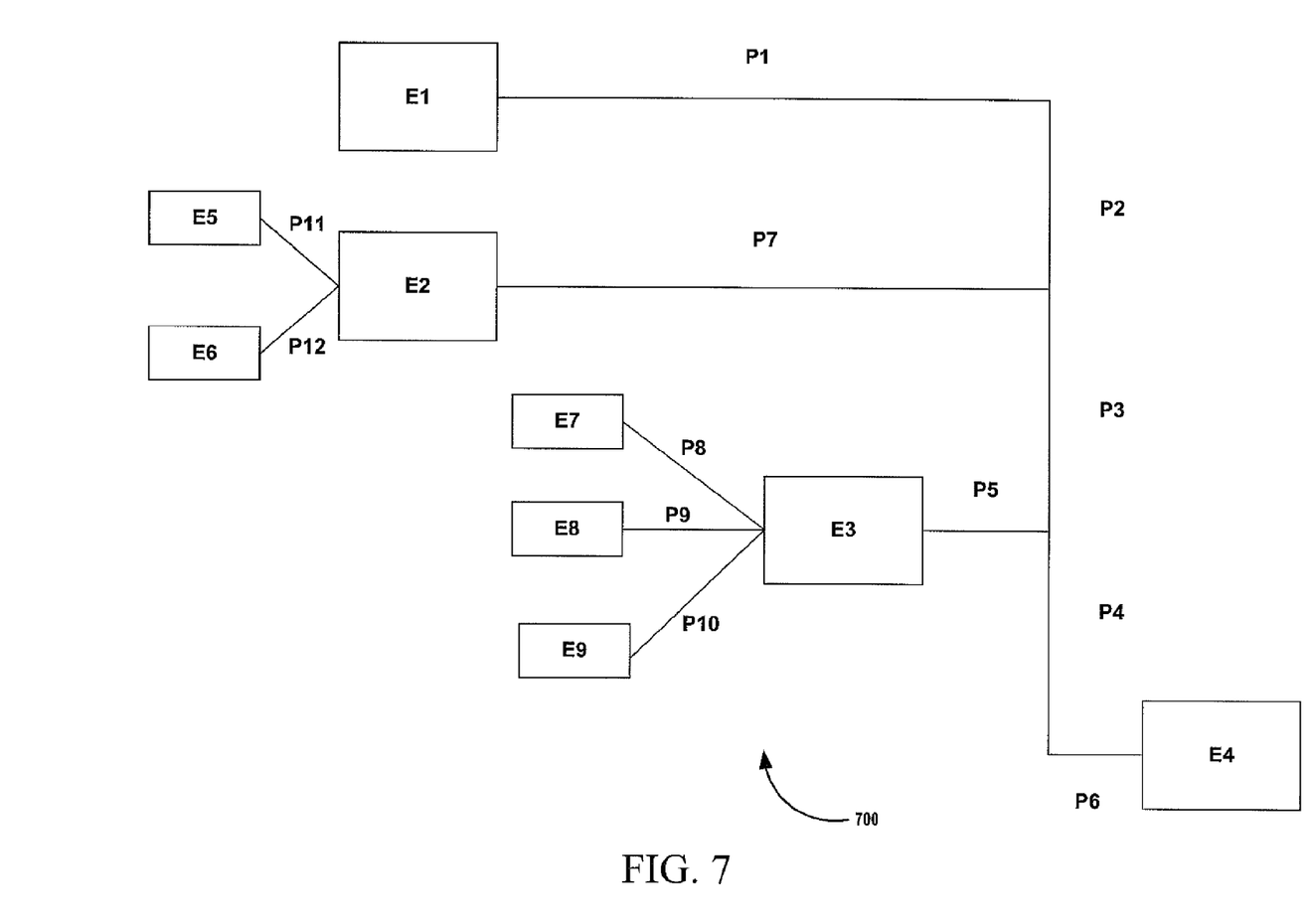
FIG. 7 illustrate a schematic representation of connections between equipments in a three dimensional functional space reservation system using which a spider-net module of FIG. 3 outputs a network of connected components associated with the three dimensional functional space reservation system, according to an embodiment of the invention.

FIG. 7 illustrate a schematic representation 700 of connections between equipments in a three dimensional functional space reservation system using which the spider-net module 340 outputs a network of connected components associated with the three dimensional functional space reservation system, according to one embodiment. In FIG. 7, various connections between equipments E1-E9 in the three dimensional functional space reservation system are shown. A connection between any two equipments is represented by a route. Each route may be having one or more pathways for connecting the two equipments. For example, the connection between the equipments 805A and 805D is represented by a route E1-E4. Further, the pathways passing through the route E1-E4 may include P1, P2, P3, P4 and P6.

In the example embodiment illustrated in FIG. 7, Table 1 shows various routes and one or more pathways associated with each route that connects two equipments in the three dimensional functional space reservation system.

TABLE 1

| Route | Pathway(s) |
|---|---|
| E1-E2 | P1 P2 P7 |
| E1-E3 | P1 P2 P3 P5 |
| E1-E4 | P1 P2 P3 P4 P6 |
| E3-E7 | P8 |
| E3-E8 | P9 |
| E3-E9 | P10 |
| E2-E5 | P11 |
| E2-E6 | P12 |
| E2-E3 | P7 P3 P5 |
| E2-E4 | P7 P3 P4 P6 |

As shown in Table 1, a route E1-E2 includes pathways P1, P2 and P7, a route E1-E3 includes pathways P1, P2, P3 and P5, a route E1-E4 include pathways P1, P2, P3, P4 and P6, a route E3-E7 includes a pathway P8, a route E3-E8 includes a pathway P9, a route E3-E9 includes a pathway P10, a route E2-E5 includes a pathway P11, a route E2-E6 includes a pathway P12, a route E2-E3 includes pathways P7, P3 and P5 and a route E2-E4 includes pathways P7, P3, P4 and P6.

Consider that, a user selects the pathway P3 to know which of equipments in the three dimensional functional space reservation system are connected to the pathway P3. In such a case, the spider-net module 340 may display the equipments E1, E2, E3 and E4 associated with the pathway P3, according to the example embodiment illustrated in FIG. 7. Further, the spider-net module 340 may display routes for each of the equipments E1 to E4 passing through the pathway P3 as shown in Table 2 below.

TABLE 2

| Pathway | Equipment | Route(s) |
|---|---|---|
| P3 | E1 | E1-E2, E1-E3, E1-E4 |
| | E2 | E1-E2, E2-E5, E2-E6 |
| | E3 | E1-E3, E3-E7, E3-E8, E3-E9 |
| | E4 | E1-E4 |

Furthermore, the spider-net module 340 may display pathways connected to the routes associated with each of the equipments E1 to E4 passing through the pathway P3 as shown in Table 3 below.

TABLE 3

| Pathway | Equipment | Route | Pathway(s) Connected |
|---|---|---|---|
| P3 | E1 | E1-E2 | P1 P2 P7 |
| | | E1-E3 | P1 P2 P3 P5 |
| | | E1-E4 | P1 P2 P3 P4 P6 |

TABLE 3-continued

| Pathway | Equipment | Route | Pathway(s) Connected |
|---------|-----------|-------|----------------------|
|         | E2        | E1-E2, | P1 P2 P7 |
|         |           | E2-E5 | P8 |
|         |           | E2-E6 | P9 |
|         | E3        | E1-E3 | P1 P2 P3 P5 |
|         |           | E3-E7 | P10 |
|         |           | E3-E8 | P11 |
|         |           | E3-E9 | P12 |
|         | E4        | E1-E4 | P7 P3 P4 P6 |

Figure 8A:
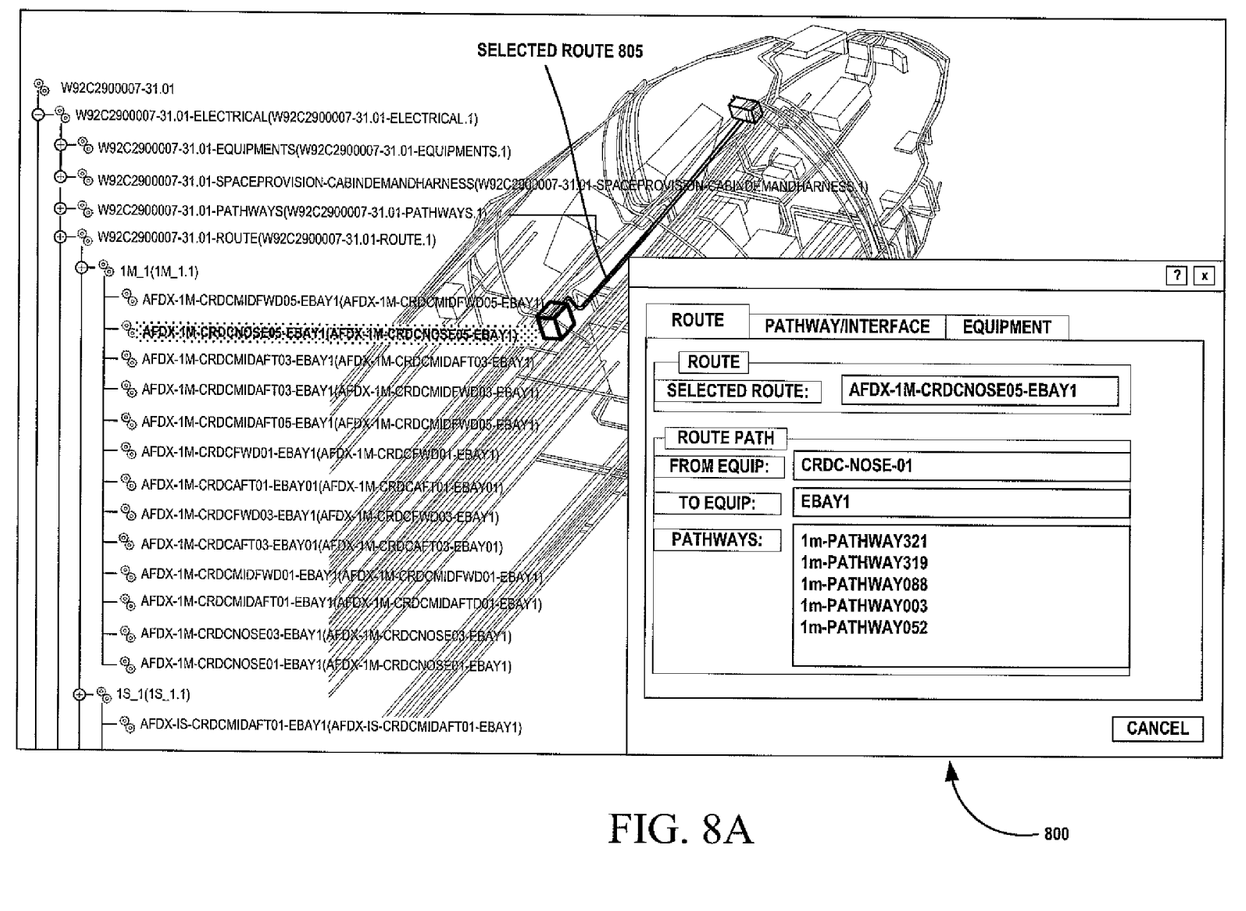
FIGS. 8A-8C illustrate screenshot views showing a network of connected components associated with the three dimensional functional space reservation system, generated using the file reader tool of FIG. 3, of a particular functionality, according to an embodiment of the invention.
Figure 8B:
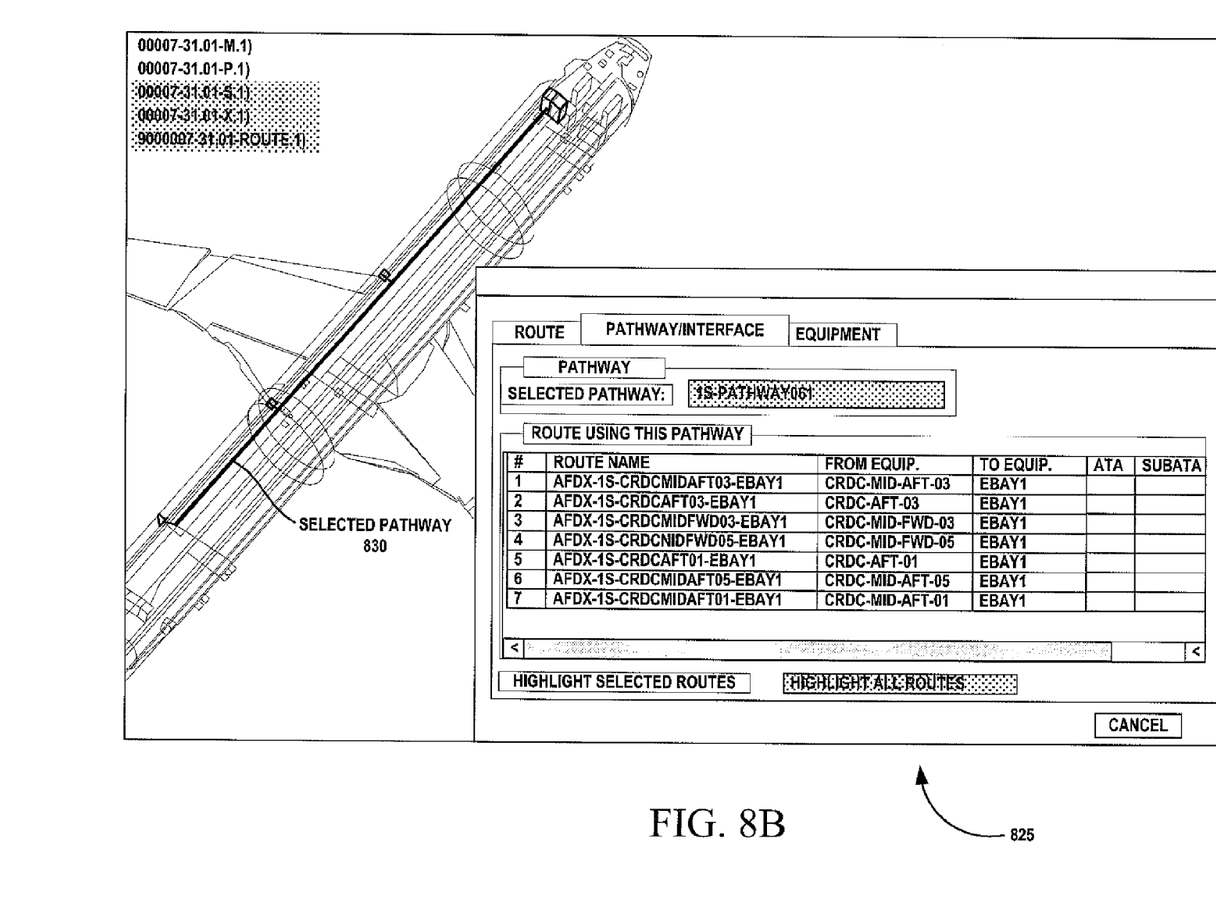
Figure 8C:
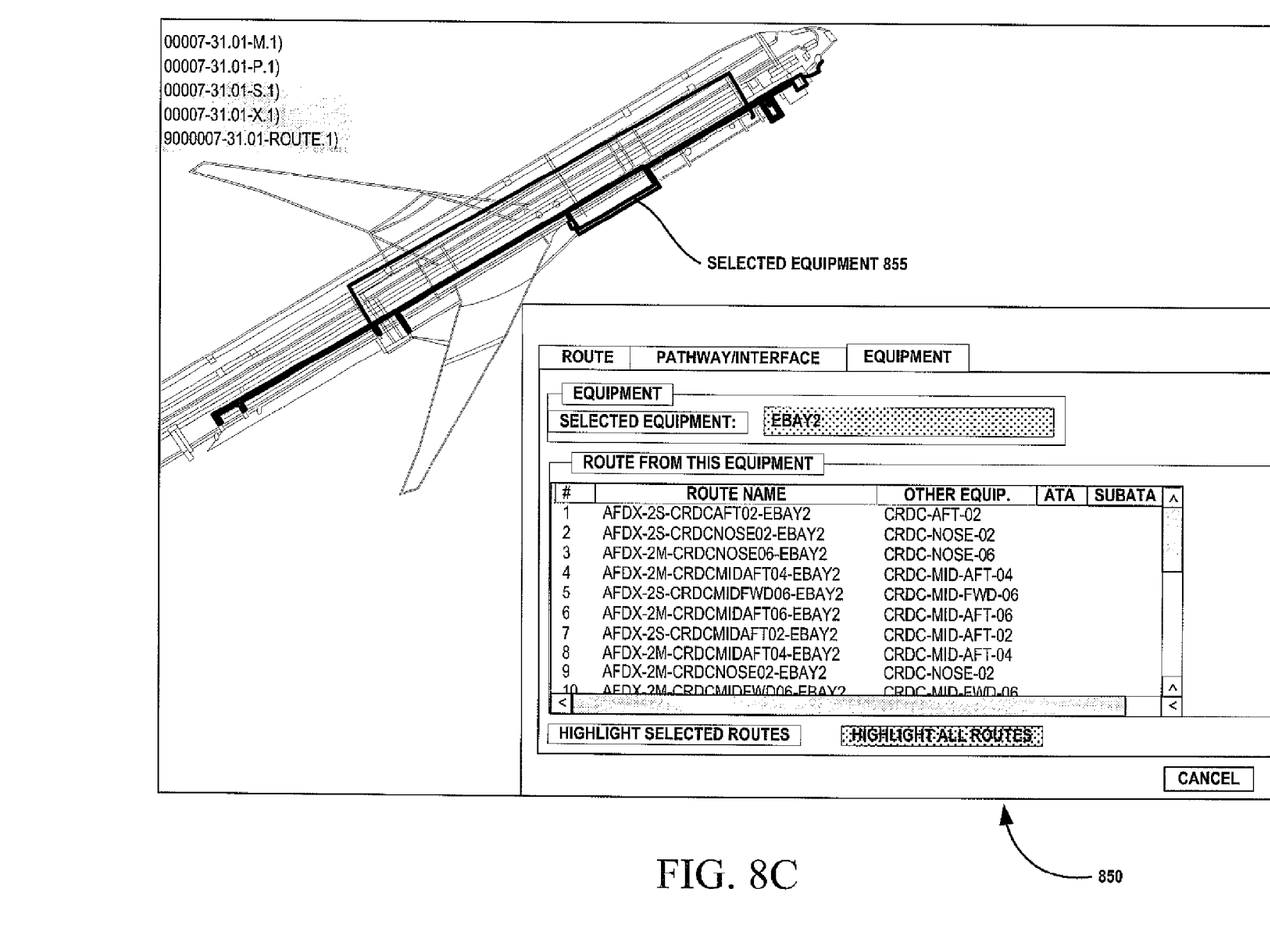

In this manner, the spider-net module 340 enables the user to visualize various signals that are communicated between the equipments E1-E9 and type of signals carried by a pathway selected by the user. In one embodiment, the spider-net module 340 may highlight a network of connected components in the three dimensional functional space reservation system associated with a pathway, a route or an equipment selected by the user, as illustrated in FIGS. 8A-8C. This may help the user in performing analysis and save time required to manually search the various components connected in the three dimensional functional space reservation system.

FIGS. 8A-8C illustrate screenshot views 800, 825 and 850 showing networks of connected components associated with the three dimensional functional space reservation systems, generated using the file reader tool 300 of FIG. 3, of a particular functionality, according to an embodiment of the invention. In one example embodiment, the network of the connected components of the particular functionality provides a logical connection between various design entities of the three dimensional functional space reservation systems.

In FIG. 8A, the screenshot view 800 displays a network of connected components for a route 805 selected by a user (e.g., design engineer). For example, the network for the selected route 805 is displayed by highlighting connected equipments and pathways associated with the selected route 805. In FIG. 8B, the screenshot view 825 displays a network of connected components for a pathway 830 selected by the user. For example, the network for the selected pathway 830 is displayed by highlighting routes passing through the selected pathway 830 and equipments connected to the routes. In FIG. 8C, the screenshot view 850 displays a network of connected components for an equipment 855 selected by the user. For example, the network for the selected equipment 855 is displayed by highlighting all routes connected to the selected equipment 855.

Figure 9:
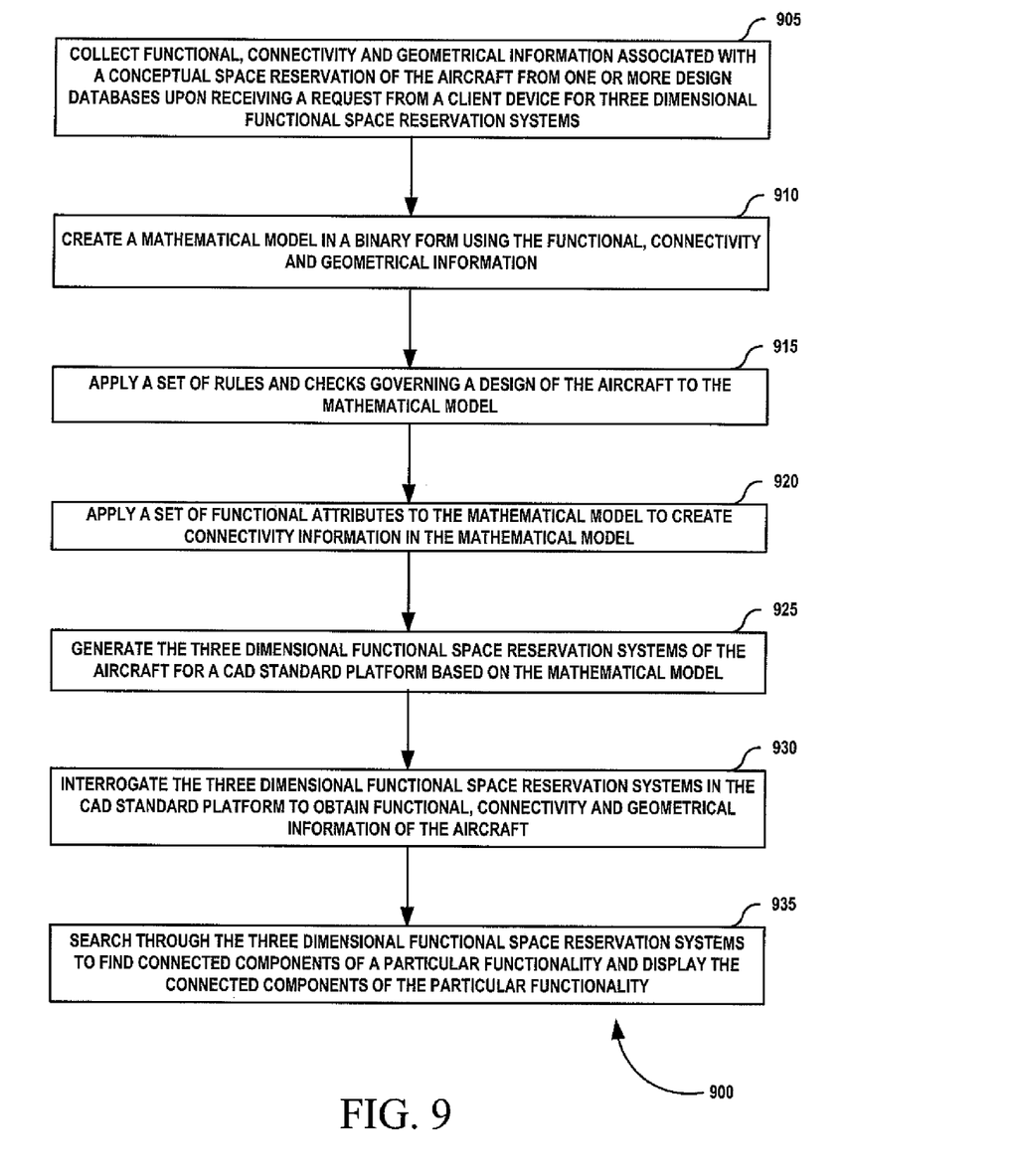
FIG. 9 illustrates a process flowchart of an exemplary method for generating three dimensional functional space reservation systems of an aircraft, according to an embodiment of the invention.

FIG. 9 illustrates a process flowchart of an exemplary method 900 for generating three dimensional functional space reservation systems of an aircraft, according to an embodiment of the invention. In step 910, functional, connectivity and geometrical information associated with a conceptual space reservation of the aircraft is collected from one or more design databases (e.g., a graphics tool database, a legacy CAD tool database, an equipment database, a schematic database and the like).

In one embodiment, the functional, connectivity and geometrical information is collected upon receiving a request from a client device for three dimensional functional space reservation systems of the aircraft. In step 915, a mathematical model is created using the functional, connectivity and geometrical information. The mathematical model is created in a binary form and is stored in memory of an application server (e.g., one of the application servers 410A-N of FIG. 4).

In step 915, a set of rules and checks governing a design of the aircraft is applied to the mathematical model. The set of design rules are applied with respect to color layering, naming and part numbering of design entities based on a design standard, an information system standard and/or a PLM database standard.

In step 920, a set of functional attributes is applied to the mathematical model to create connectivity information in the mathematical model. In one embodiment, the set of functional attributes is applied by setting pressure, flow, and temperature on a hydraulic system of the aircraft. Also, the set of functional attributes are applied by setting voltage, current, and routing information on an electrical system of the aircraft.

In step 925, the three dimensional functional space reservation systems of the aircraft for a CAD platform are generated based on the mathematical model. In one example embodiment, the three dimensional functional space reservation systems are generated by generating each object in the three dimensional functional space reservation systems as a three dimensional design entity with at least one functional link to the three dimensional entity of the three dimensional functional space reservation systems. Further, each of the three dimensional design entities is stored in a file format in a PLM database.

In step 930, the three dimensional functional space reservation systems in the CAD standard platform are interrogated to obtain functional, connectivity and geometrical information of the aircraft. In step 935, the three dimensional functional space reservation systems are searched through to find connected component of a particular functionality. Further, in step 935, the connected components associated with the three dimensional functional space reservation systems of the particular functionality are displayed on a display device.

Figure 10:
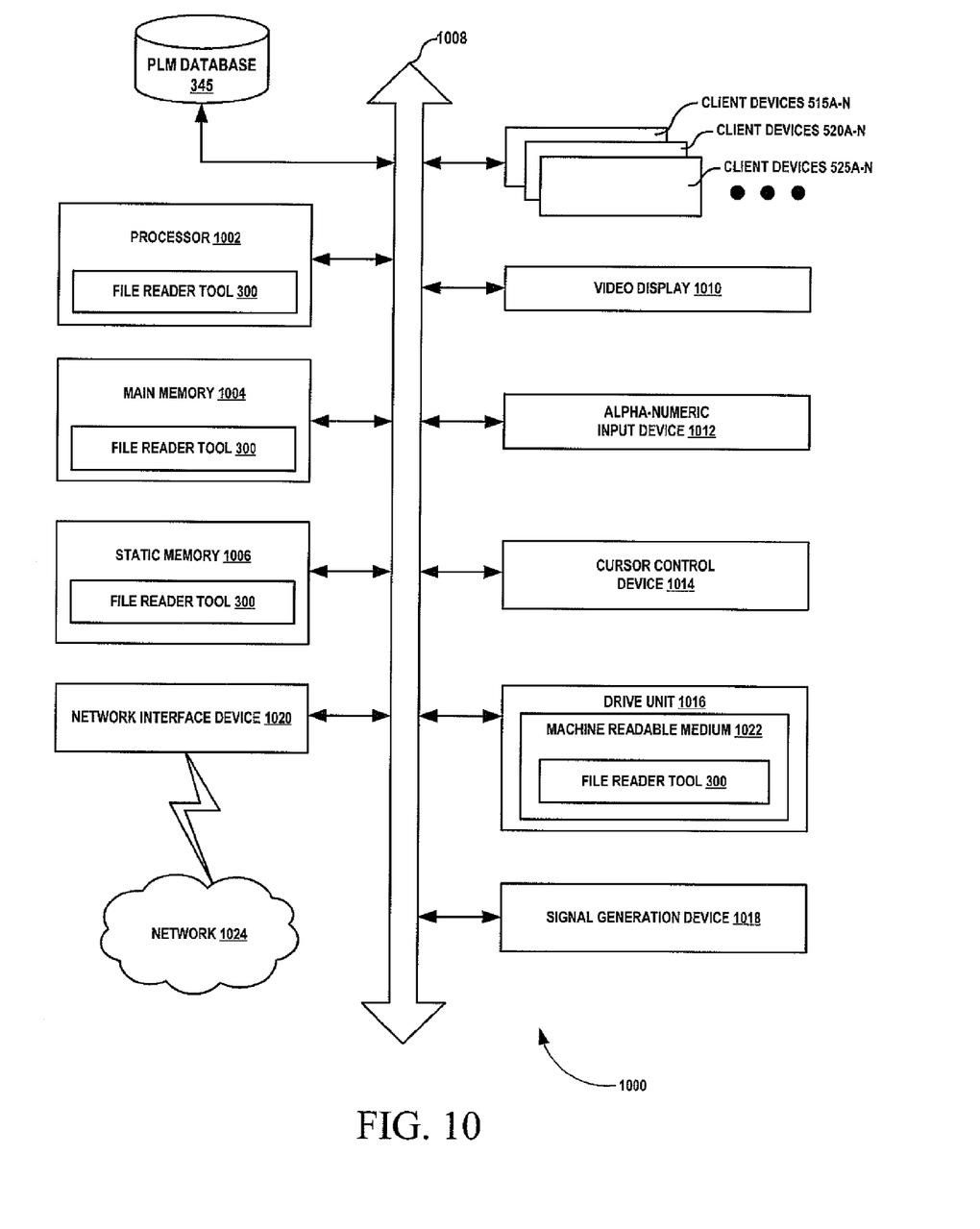
FIG. 10 illustrates a diagrammatic system view of an example data processing system of an aircraft system architecture design in which any of the embodiments disclosed herein may be performed, according to an embodiment of the invention.

FIG. 10 illustrates a diagrammatic system view of an example data processing system 1000 of an aircraft design system in which any of the embodiments disclosed herein may be performed, according to an embodiment of the invention. Particularly, the diagrammatic system view of FIG. 10 illustrates a processor 1002, a main memory 1004, a static memory 1006, a bus 1008, a video display 1010, an alphanumeric input device 1012, a cursor control device 1014, a drive unit 1016, a signal generation device 1018, a network interface device 1020, a machine readable medium 1022, a network 1024, a file reader tool 300, the PLM database 345, and client devices 410A-N, client device 412A-N and client devices 414A-N.

The diagrammatic system view may indicate the data processing system 1000 in which one or more operations disclosed herein are performed. The processor 1002 may be a microprocessor, a state machine, an application specific integrated circuit, a field programmable gate array, etc. The main memory 1004 may be a dynamic random access memory and/or a primary memory of a computer system. The static memory 1006 may be a hard drive, a flash drive, and/or other memory information associated with the data processing system 1000.

The bus 1008 may be an interconnection between various circuits and/or structures of the data processing system 1000. The video display 1010 may provide graphical representation of information on the data processing system 1000. The alpha-numeric input device 1012 may be a keypad, keyboard and/or any other input device of text (e.g., a special device to aid the physically handicapped). The cursor control device 1014 may be a pointing device such as a mouse. The drive unit 1016 may be a hard drive, a storage system, and/or other longer term storage subsystem.

The signal generation device 1018 may be a basic input output system (BIOS) and/or a functional operating system of the data processing system 1000. The network interface device 1020 may perform interface functions (e.g., code conversion, protocol conversion, and/or buffering) required for communications to and from the network 1026 between a number of independent devices (e.g., of varying protocols). The machine readable medium 1022 may provide instructions on which any of the methods disclosed herein may be performed. For example, the machine readable medium or computer readable storage medium 1022 may have instructions, that when executed by a computer (e.g., the data processing system 1000), causes the computer to perform a method as illustrated in FIG. 9.

The file reader tool 300 may provide source code and/or data code to the processor 1002 to enable any one or more operations disclosed herein. The PLM database 345 coupled to the data processing system 1000 may be a database coupled to the processor 1002. The PLM database may be configured for storing the three dimensional functional space reservation systems automatically generated based on functional, connectivity and geometrical information associated with a conceptual space reservation of the aircraft using the file reader tool 300. The client devices 410A-N, 412A-N and 414A-N may be desktops, workstations, or laptops which access the three dimensional functional space reservation systems from the PLM database 345 via the network 1024.

In various embodiments of the systems and methods described in FIGS. 2 through 10, the present invention provides a real-world three dimensional geometry of various systems associated with the aircraft to design engineers at the conceptual space reservation phase. Thus, the above-described methods and systems enable the design engineers to perform analysis of the real-world three dimensional geometry at the conceptual space reservation phase. The above-described methods and systems significantly reduce the development life cycle of the aircraft and enable greater number of iterations in short duration. The above-described methods and systems also provide the functionality and connectivity information of the aircraft by interrogating the three dimensional functional space reservation systems in the CAD standard platform.

Although the systems and methods in FIGS. 2 through 10 are described with respect to generation of three dimensional functional space reservation systems of an aircraft from a conceptual space reservation, one can envision that the systems and methods described herein can be used to generate three dimensional functional space reservation systems of other vehicles such as ship, train and the like.

A skilled person will recognize that many suitable designs of the systems and processes may be substituted for or used in addition to the configurations described above. It should be understood that the implementation of other variations and modifications of the embodiments of the invention and its various aspects will be apparent to one ordinarily skilled in the art, and that the invention is not limited by the exemplary embodiments described herein and in the claims. Therefore, it is contemplated to cover the present embodiments of the invention and any and all modifications, variations, or equivalents that fall within the true spirit and scope of the basic underlying principles disclosed and claimed herein.

What is claimed is:

1. A system for generating three dimensional functional space reservation systems of a vehicle, comprising:
    a processor; and
    memory coupled to the processor, wherein the memory comprises a file reader tool including:
        a functional geometrical information (FGI) reader module for collecting functional, connectivity and geometrical information from one or more design databases associated with a conceptual space reservation of the vehicle upon receiving a request from a client device for three dimensional functional space reservation systems;
        a mathematical modeler module for receiving the functional, connectivity and geometrical information and creating a mathematical model in a binary form;
        a standardization module for applying a set of rules and checks governing a design of the vehicle to the mathematical model;
        a functional mapper module for applying a set of functional attributes to the mathematical model to create connectivity information in the mathematical model;
        a writer module for generating the three dimensional functional space reservation systems of the vehicle for a computer-aided design (CAD) standard platform based on the mathematical model; and
        an interrogating module for interrogating the three dimensional functional space reservation systems in the CAD standard platform to provide functional, connectivity and geometrical information of the vehicle, wherein the interrogating module comprises a spider-net module that searches through the three dimensional functional space reservation systems to find connected components of a particular functionality.

2. The system of claim 1, wherein the spider-net module displays the connected components of the particular functionality on a display device.

3. The system of claim 2, wherein the connected components comprise components selected from the group consisting of equipments, one or more pathways and routes.

4. The system of claim 1, wherein the three dimensional functional space reservation systems comprises systems selected from the group consisting of a hydraulic system, and an electrical system.

5. The system of claim 1, wherein the set of rules and checks comprises a set of design rules and checks with respect to color layering, naming and part numbering of design entities based on at least one design standard, information system standard, and PLM database standard.

6. The system of claim 1, wherein the set of rules and checks are configured to check feasibility, thumb rule and prior vehicle system design knowledge from previous design programs.

7. The system of claim 1, wherein the set of functional attributes comprises setting pressure, flow, and temperature on a hydraulic system in the vehicle or setting voltage, current, and route information on an electrical system in the vehicle.

8. The system of claim 1, wherein the vehicle is selected from the group consisting of an aircraft, a ship, and a train.

9. A network system for generating three dimensional functional space reservation systems of an vehicle, comprising:
    a plurality of client devices for generating a request for the three dimensional functional space reservation systems of the vehicle;
    a plurality of database servers having a plurality of design databases, wherein each of the plurality of design databases stores functional, connectivity and geometrical information associated with a conceptual space reservation of the vehicle;
    a plurality of application servers for generating the three dimensional functional space reservation systems of the vehicle for a computer-aided design (CAD) standard platform based on the functional, connectivity and geometrical information associated with the conceptual space reservation, wherein each of the plurality of application servers comprises a file reader tool, including:

a functional geometrical information (FGI) reader module for collecting the functional, connectivity and geometrical information from the plurality of design databases associated with the conceptual space reservation of the vehicle upon receiving a request from one of the plurality of client devices for the three dimensional functional space reservation systems;

a mathematical modeler module for receiving the functional, connectivity and geometrical information and creating a mathematical model in a binary form in memory;

a standardization module for applying a set of rules and checks governing a design of the vehicle to the mathematical model;

a functional mapper module for applying a set of functional attributes to the mathematical model to create connectivity information in the mathematical model;

a writer module for generating the three dimensional functional space reservation systems of the vehicle for the (CAD) standard platform based on the mathematical model; and an interrogating module for interrogating the three dimensional functional space reservation systems in the CAD standard platform to provide functional, connectivity and geometrical information of the vehicle, wherein the interrogating module comprises a spider-net module that searches through the three dimensional functional space reservation systems to find connected components of a particular functionality; and a project lifecycle management (PLM) database for storing the three dimensional functional space reservation systems.

10. The network system of claim 9, wherein the plurality of application servers are configured to return the three dimensional functional space reservation systems of the vehicle to the one of the plurality of client devices in response to the request for three dimensional functional space reservation systems.

11. A method for generating three dimensional functional space reservations systems of an vehicle, comprising:

collecting functional, connectivity and geometrical information from one or more design databases associated with a conceptual space reservation of the vehicle by a functional geometrical information (FGI) reader module upon receiving a request from a client device for the three dimensional functional space reservation systems;

creating a mathematical model in a binary form using the functional, connectivity and geometrical information by a mathematical modeler module;

applying a set of rules and checks governing a design of the vehicle to the mathematical model by a standardization module;

applying a set of functional attributes to the mathematical model for creating connectivity information in the mathematical model by a functional mapper module;

generating the three dimensional functional space reservation systems of the vehicle for a computer-aided design (CAD) standard platform based on the mathematical model by a writer module;

interrogating the three dimensional functional space reservation systems in the CAD standard platform to provide functional, connectivity and geometrical information of the vehicle by an interrogating module; and searching the three dimensional functional space reservation systems to find connected components of a particular functionality by a spider-net module residing in the interrogating module.

12. The method of claim 11, further comprising displaying the connected components associated with the three dimensional functional space reservation systems of the particular functionality.

13. The method of claim 11, wherein the applying the set of rules and checks comprises applying a set of design rules and checks with respect to color layering, naming and part numbering of design entities according to at least one design standard, information system standard and project lifecycle management (PLM) database standard.

14. The method of claim 11, wherein the generating the three dimensional functional space reservation systems comprises generating each object in the three dimensional functional space reservation systems as a three dimensional design entity with at least one functional link to at least one other three dimensional design entity of the three dimensional functional space reservation systems.

15. A non-transitory computer-readable storage medium having instructions that, when executed by a computing platform, causes the computing platform to perform a method of generating three dimensional functional space reservations systems of an vehicle, the instructions comprising:

a functional geometrical information (FGI) reader module for collecting functional, connectivity and geometrical information associated with a conceptual space reservation of the vehicle from one or more design databases upon receiving a request from a client device for three dimensional functional space reservation systems;

a mathematical modeler module for creating a mathematical model in a binary form using the functional, connectivity and geometrical information;

a standardization module for applying a set of rules and checks governing a design of the vehicle to the mathematical model;

a functional mapper module for applying a set of functional attributes to the mathematical model to create connectivity information in the mathematical model;

a writer module for generating the three dimensional functional space reservation systems of the vehicle for a computer-aided design (CAD) standard platform based on the mathematical model; and an interrogating module for interrogating the three dimensional functional space reservation systems in the CAD standard platform to provide functional, connectivity and geometrical information of the vehicle, wherein the interrogating module comprises a spider-net module that searches through the three dimensional functional space reservation systems to find connected components of a particular functionality.

* * * * *